April 22, 1969 A. P. ARNTSEN 3,440,578

DUAL MODE TUNING CIRCUITS

Filed July 12, 1965

WITNESSES:

Bernard R. Gieguez

James F. Young

INVENTOR.
Arnt P. Arntsen.

BY

Samuel Otti

ATTORNEY

United States Patent Office 3,440,578

Patented Apr. 22, 1969

3,440,578

DUAL MODE TUNING CIRCUITS

Arnt P. Arntsen, Manchester, Mass., assignor to Westinghouse Electric Corporation, Pittsburgh, Pa., a corporation of Pennsylvania Filed July 12, 1965, Ser. No. 471,174
Int. Cl. H03j 3/28
U.S. Cl. 334—45 5 Claims

ABSTRACT OF THE DISCLOSURE

A dual mode tuning circuit is disclosed wherein a pair of capacitors, which may be ganged, are utilized for tuning into separate tuning bands, for example, the very high frequency and the ultra high frequency bands. A pair of inductive elements are utilized having one end commonly connected and the pair of capacitors connected across the other end. The inductive elements are so selected to provide tuning inductance in one of the frequency bands but negligible inductive reactance in a second of the bands. A third inductive element is provided and is selected to provide tuning inductance in the second of the tuning bands while not affecting operation tuning in the first of the bands. This third inductor may for example be connected to point of common potential of the pair of inductive elements.

The present invention relates to tuning circuits, and more particularly to tuning circuits tunable over at least two frequency bands.

Tuning circuitry is required in television receivers which must have a capability of being tunable over two separate bands of frequencies, namely, the very high frequency (VHF) band and the ultrahigh frequency (UHF) band. The common solution for obtaining such a capability is to utilize separate tuning circuits and circuit elements for each of the bands, together with associated switching circuits interconnecting the separate circuits to accommodate the reception of the desired frequency band. Thus, in a typical television receiver, completely separate VHF and UHF tuners are provided, together with the necessary switching circuitry mechanical and electrical necessary to insert the appropriate tuning elements depending upon which frequency band is to be received. An obvious disadvantage of using separate tuning circuits is that of increased cost since separate components must be provided in each of the tuner circuits. Another major disadvantage is the necessity of providing switching circuits between the tuning circuits to place the appropriate tuning elements in the circuit and to take out the unwanted ones.

In conventional television tuners for both, or either, the VHF and UHF frequency bands, the variable tuning elements are inductors. Either coils of different values of inductance are switched into the tuned circuit mechanically for each channel, or a variable inductance coil is used to provide the various values required. A particular disadvantage of the switched inductor type of tuner is that the electrical contacts become dirty and worn after short periods of time and hence require maintenance or replacement. In the continuously variable inductor type of tuner, a serious disadvantage is that only relatively poor electrical characteristics can be obtained, especially at the extremes of the frequency band.

The problems associated with inductively tuned circuits can be eliminated by the use of capacitive tuning, that is, utilizing a capacitor as the variable tuning element of the tuned circuit. Reference is made to copending application Ser. Nos. 359,560, 359,561 and 359,562, all of which are assigned to the same assignee as the instant invention.

In these applications, various tunable circuits are shown employing capacitive tuning, which provide a constant bandwidth for the various channels used for television transmission, as well as providing excellent electrical characteristics without the necessity of electrically switching in different physical components for the various channels.

It therefore, becomes apparent that it would be highly desirable to provide a tuning circuit which is tunable over two frequency bands and which does not require switching circuitry to receive frequencies within either of these bands. Moreover, it would be further desirable to provide tuning circuitry which does not require the switching of physical components for the various tuning operations and which employs the advantages of capacitive tuning.

It is therefore, an object of the present invention to provide a new and improved tuning circuit.

It is a further object to provide a new and improved tuning circuit tunable over at least two frequency bands.

It is still a further object to provide a new and improved tuning element which does not require a use of switching circuitry for reception or tuning within either of two separate frequency bands.

It is still a further object to provide a new and improved tuning element tunable to at least two frequency bands which provides low cost by utilizing the same circuitry for each of the bands.

It is a further object to provide a new and improved tuning circuit which utilizes capacitive tuning.

It is a further object to provide a dual mode tuning circuit which is operative in one mode to receive frequencies within one frequency band and it is operative in another mode to receive frequencies in another frequency band.

It is still a further object to provide a new and improved tuning element tunable to frequencies in at least two frequency bands wherein components thereof utilized for tuning in one of the bands has substantially no effect upon tuning in other of the bands.

It is still a further object to provide a tuning structure wherein the above desired advantages are accomplished in a simplified, and efficient and novel mechanical structure.

Accordingly, the present invention broadly provides tuning circuitry which is operative in a dual mode to permit tuning in two separate frequency bands, with capacitance being used as the variable element for tuning. In a first mode of operation, the tuned circuit comprises a variable capacitance and an inductance. The inductance is so selected that it will together with the capacitance tune over a first band of frequencies, but will have little or no effect in the tuning of a second band of frequencies. In a second mode of operation, inductance from a separate element is utilized to complete the tuned circuit with the variable capacitance, with this later named inductance being so connected as not to affect the operation of the circuit in the first mode. Tuning is thus accomplished in separate frequency bands by utilizing variable capacitance which is common to two inductive components that are so connected to permit independent tuning in each of the frequency bands.

These and other objects and advantages of the present invention will become more apparent when considered in view of the following specification and drawings, in which.

Figure 1:
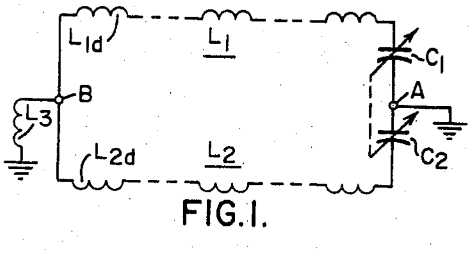
FIGURE 1 is a schematic diagram of one embodiment of the present invention.

Referring now to FIG. 1, the tuning circuit of the present invention is shown utilizing a pair of capacitors $C_1$ and $C_2$ as the tuning elements thereof. The capacitors $C_1$ and $C_2$ are variable, as shown by the symbol and are ganged together so that they will be varied together accordingly. For purposes of discussion of FIG. 1, consider that the capacitive values of $C_1$ and $C_2$ are substantially equal for the various tuning positions. One end of each of the capacitors is connected at a junction A therebetween, which is in turn connected to ground. The other end of the capacitor $C_1$ is connected to a distributed inductance line $L_1$, and the other end of the capacitor $C_2$ is connected to a distributed inductance line $L_2$. The lines $L_1$ and $L_2$ have one end commonly connected at a junction B.

The lines $L_1$ and $L_2$ may be considered to present schematically a plurality of inductive values $L_{1d}$ and $L_{2d}$, respectively. It has been found that utilizing distributive inductance for lines $L_1$ and $L_2$ provides an advantageous electrical and mechanical configuration for the tuned circuit, as will be discussed below. However, it should be understood that lumped components could also be utilized to construct the inductive lines $L_1$ and $L_2$.

For purposes of discussion of FIG. 1, it is assumed that the composite inductance of the lines $L_1$ and $L_2$ is substantially equal with the lines being substantially symmetrical with respect to each other. The values of inductance for the lines $L_1$ and $L_2$ are so selected to be effective in supplying a sufficient tuning inductance to tune the circuit of FIG. 1 along with the capacitors $C_1$ and $C_2$ to frequencies within a given frequency band, for example, the ultrahigh frequency (UHF) band for television reception. Inductive values of $L_1$ and $L_2$ are also selected to provide substantially little inductance in a lower band of frequencies, such as the very high frequency (VHF) band. Thus, the lines $L_1$ and $L_2$ so designed will be effective for tuning in the UHF frequency band, but in the VHF band the lines will merely provide an electrical connection to the tuning capacitor $C_1$ and $C_2$. For purposes of discussion herein, the VHF and UHF frequency bands will be referred to; however, it should be understood that this reference is made only as exemplary of one embodiment and that other bands of frequencies can be utilized by the proper selection of components.

With the assumption that $C_1$ is equal to $C_2$ and $L_1$ is equal to $L_2$, in the UHF frequency band a balanced bridge circuit is provided including these components. Thus, with the junction A between the capacitor $C_1$ and $C_2$ being grounded, the junction B between the lines $L_1$ and $L_2$ will be a virtual ground potential point. Since the junction B is effectively at ground potential, a coil $L_3$ may be connected thereto with the other end of the coil $L_3$ beingg rounded without affecting the balanced bridge circuit and thus without affecting the tuning in the UHF band. The inductor $L_3$ could equally well have been connected from the point A to ground without affecting the operation of the circuit in the UHF band.

The balanced bridge circuit of FIG. 1, including the inductive lines $L_1$ and $L_2$ and the capacitors $C_1$ and $C_2$, comprise a tuned circuit within the ultra high frequency band which may be tuned by the variable capacitors $C_1$ and $C_2$ to frequencies within this band. When the coil $L_3$ is connected to the point B, which is at virtual ground, it is not within the bridge tuning circuit and hence does not effect the tuning thereof. Likewise, if the coil $L_3$ is connected between point A and ground, it is also outside of the bridge tuning circuit, and it will have no affect on the tuning thereof.

Figure 2:
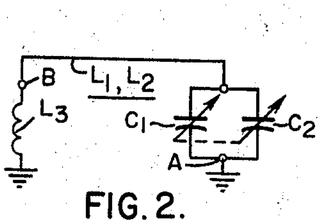
FIG. 2 is a simplified schematic diagram to demonstrate the operation of FIG. 1 when operative to one of its modes.

As was mentioned above, the inductance lines $L_1$ and $L_2$ provide the tuning inductance at UHF frequencies, however, at the lower frequencies of the VHF band, the inductive lines $L_1$ and $L_2$ present very little inductive reactance and may for all practical purposes be considered to provide a direct electrical connection from the coil $L_3$ to the pair of capacitors $C_1$ and $C_2$. In other words, the connection has negligible impedance at VHF frequencies. As is shown in FIG. 2, the capacitors $C_1$ and $C_2$ are now connected in the parallel with the point A at ground potential and the point B directly connected through lines $L_1$ and $L_2$ to the other commonly connected end of the capacitors $C_1$ and $C_2$. The inductor, coil $L_3$ is thus directly connected across the parallel combination of the variable capacitors $C_1$ and $C_2$.

It should be noted that the point B is not at a ground potential when tuning within the VHF band but is directly connected to the upper end of the parallel combination of the capacitors $C_1$ and $C_2$. A second tuned circuit is thus provided which is operative in the VHF frequency band independently of the first tuned circuit discussed, including the inductors $L_1$ and $L_2$. Both tuned circuits, however, contain the ganged capacitors $C_1$ and $C_2$ as their variable tuning element. The capacitors $C_1$ and $C_2$ are connected in a bridge configuration when being tuned in the UHF frequency band, and are connected in parallel with the coil $L_3$ when being tuned in the VHF frequency band.

The circuit of FIG. 1 thus shows a dual mode tuning element which is tunable to frequencies within two bands of frequency. The dual mode of operation may be described in terms of balanced and unbalanced modes of operation. When receiving frequencies in the UHF band, the mode of operation may be described as a balanced mode. That is, the tap junction A between the capacitors $C_1$ and $C_2$ is grounded as is the analogous point B in the bridge circuit. Therefore, the bridge circuit is balanced with both the points A and B being at ground potential. The tuning components of the tuned circuit in the UHF band then comprise capacitors $C_1$ and $C_2$ and the inductive lines $L_1$ and $L_2$ only, with the inductive coil $L_3$ being effectively out of the circuit at UHF frequencies. The bridge configuration with the grounded tap between the capacitors $C_1$ and $C_2$ and effectively between the inductive lines $L_1$, $L_2$ effects a balanced mode of operation, at UHF frequencies when the inductances of the lines $L_1$ and $L_2$ are effective to provide a balanced bridge circuit.

When lower frequency signals, within the VHF band for example, are received, the tuning circuit of FIG. 1 operates in an unbalanced mode as shown in FIG. 2. In this mode of operation, the capacitors $C_1$ and $C_2$ are connected in parallel across the inductive coil $L_3$, since the inductance of the lines $L_1$ and $L_2$ are such that their reactances can be neglected at frequencies within the VHF band. In the unbalanced mode as shown in FIG. 2, the bridge circuit including the lines $L_1$ and $L_2$ is thus inoperative.

Figure 3:
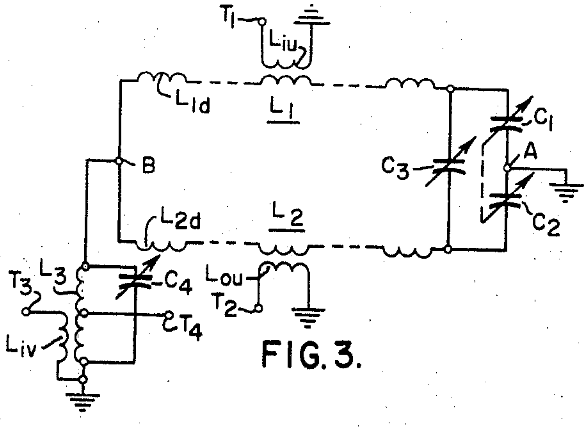
FIG. 3 is a schematic diagram of one embodiment of the present invention showing the input and output circuits thereof.

FIG. 3 shows an embodiment of the dual mode tuning circuit of the present invention in which input and output circuits are supplied thereto. In the circuit of FIG. 3 similar designations will be used for the analogous components with respect to FIG. 1. To supply input signals in the ultrahigh frequency range, an inductive coil $L_{1u}$ is inductive coupled to the line L. The coil $L_{1u}$ has an input terminal $T_1$ to which input signals within the UHF band may be applied to the coil $L_{1u}$. The other end of the coil $L_{1u}$ is grounded. The terminal $T_1$ may be connected to ultra high frequency antenna or other circuitry responsive to a band of frequencies. Input signals in the ultrahigh frequency range are thereby coupled into the tuned bridge circuit including the inductive lines $L_1$ and $L_2$ and the ganged variable capacitors $C_1$ and $C_2$. By the adjustment of the capacitors $C_1$ and $C_2$, the circuit may be tuned to the frequency of the incoming signals so that the desired signals may be translated to subsequent stages in receiving circuitry. An output coil $L_{ou}$, is inductively coupled to the inductance line $L_2$. A terminal $T_2$ is provided at one end of the coil $L_{ou}$, and the other end is grounded. From the terminal $T_2$, signals at the frequency to which the circuit is tuned to may be extracted to be applied to subsequent stages of receiving apparatus.

A trimmer capacitor $C_3$ is connected across the ganged capacitors $C_1$ and $C_2$ and is variable so as to provide a trimmer adjustment for the upper end of the ultra high frequency band.

As discussed above with reference to FIG. 1, the junctions A and B are at ground potential at frequencies within the UHF band; thus, additional circuitry may be connected to either of the points A or B without affecting the operation of the bridge circuit. In FIG. 3, the inductance coil $L_3$ is connected between the point B and ground to act as the inductive tuning element for signals in the VHF range of frequencies. Input signals in this range of frequencies are applied to the tuning circuit by an input coil $L_{iv}$, which is inductively coupled to the coil $L_3$. An input terminal $T_3$ is provided at one end of the coil $L_{iv}$ in order to provide input to signals thereto in the very high frequency range. The terminal $T_3$, for example may be connected to a VHF antenna or to a circuit responsive to such frequencies. The other end of the coil $L_{iv}$ is grounded. To frequencies within the VHF range, the circuit of FIG. 3 will have a configuration such as that of FIG. 2 with the lines $L_1$ and $L_2$ and noninductively directly connecting the inductor $L_3$ across the capacitors $C_1$ and $C_2$. To provide output signals, when the circuit is tuned in the VHF range, a tap is provided on the inductor coil $L_3$ and has an output terminal $T_4$ connected thereto to supply output signals at the tuned frequnecy to subsequent circuitry in the receiver.

Thus, with signals in the VHF frequency band being applied to the coil $L_{iv}$ and the circuit being tuned to this frequency by the adjustment of the capacitors $C_1$ and $C_2$ together with the coil $L_3$, output signals are provided at the terminal $T_4$ in response thereto. A trimmer capacitor $C_4$, which may be adjusted, is connected directly across the coil $L_3$ in order to act as a trimmer adjustment at the high end of the VHF frequency band.

The tuner circuit as shown in FIG. 3 thus operates in a dual mode with the circuit operating in a balanced mode with ultra high frequencies being applied to the input coil $L_{iu}$; the tuned circuit including the lines $L_1$ and $L_2$ and the capacitors $C_1$ and $C_2$. The circuit, however, operates in an unbalanced mode when input signals in the VHF frequency band are applied to the input coil $L_{iv}$, with the lines $L_1$ and $L_2$ providing a direct connection of the capacitors $C_1$ and $C_2$ across the VHF tuning coil $L_3$. A tuning circuit is thus provided which is capable of tuning to frequencies within two separate bands of frequencies, and wherein efficiency of components is realized in that the same variable tuning element, the ganged capacitors $C_1$ and $C_2$, are utilized for both modes of operation.

Figure 4:
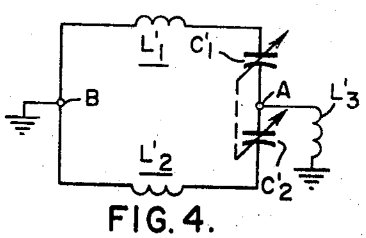
FIG. 4 is a schematic diagram of another embodiment of the present invention.

The circuits of FIGS. 1, 2 and 3 have been described with the inductance lines $L_1$ and $L_2$ shown as including distributed inductance components $L_{1d}$ and $L_{2d}$. Also the total inductance values of linear $L_1$ and $L_2$ have been assigned to be to each other, substantially equal as have the capacitive values of the capacitors $C_1$ and $C_2$. In FIG. 4, another embodiment of the present invention is shown wherein discrete values of inductance are represented by the inductor coils $L_1'$ and $L_2'$ replacing the distributed lines $L_1$ and $L_2$, respectively. The inductors $L_1'$ and $L_2'$ map have substantially equal inductive values if the ganged capacitor $C_1'$ and $C_2'$ are designed to have substantially equal capacitance values for each setting. If such be the case, the circuit of FIG. 4 will operate substantially identically to that of FIG. 1, with requirement that the lumped components $L_1'$ and $L_2'$ be effective to insert tuning inductance in the bridge circuit at UHF frequency, but will provide negligible inductance at the VHF frequencies.

But, it should be noted that it is not necessary that the values of the inductors $L_1'$ and $L_2'$ be substantially equal if a proper ratio between the inductive and capacitor values is maintained. That is, a balanced bridge configuration may be realized if a proper ratio of the inductive to capacitive elements is selected. Accordingly, if the ratio:

$$L_1/L_2=C_2/C_1$$

is maintained, proper operation may be obtained. Therefore, if the above ratio is maintained throughout the tuning adjustment of the ganged capacitor $C_1'$ and $C_2'$ by proper design, various combinations of component values may be used. When tuning in the VHF range is desired, as discussed above, the inductors $L_1'$ and $L_2'$ are effectively out of the circuit providing substantially no inductance with the coil $L_3'$ acting as the tunable inductance with the ganged capacitors $C_1'$ and $C_2'$. FIG. 4 shows the alternative connection for the coil $L_3'$, being with it connected between the junction A and ground, as compared to the connection of the coil $L_3$ to the point B as shown in FIGS. 1, 2 and 3.

Figure 5A:
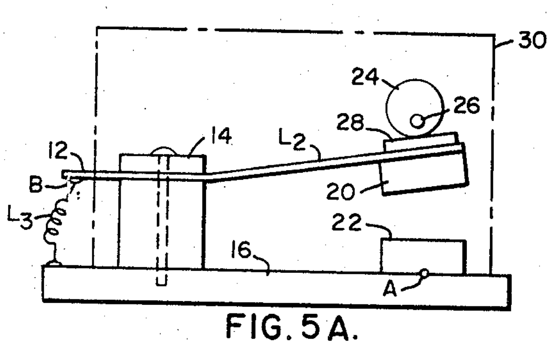
FIG. 5A is a front view of an embodiment of the mechanical structure of the present invention.
Figure 5C:
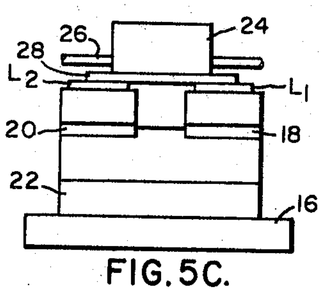
FIG. 5C is a side view of the structure of FIG. 5A.
Figure 5B:
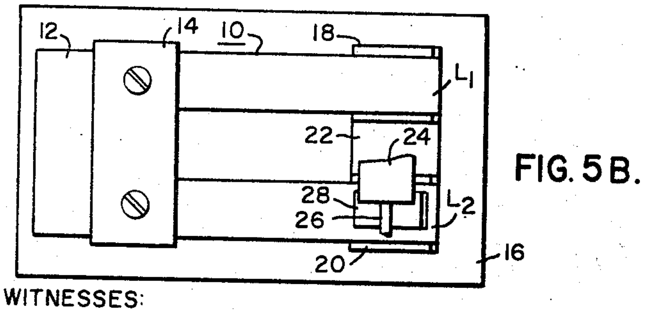
FIG. 5B is a top view of the structure of FIG. 5A.

Referring now to FIGS. 5A, 5B and 5C an example of the structural implementation of the electrical circuit of the above figures is shown. Similar character designations will be utilized in FIGS. 5A, 5B and 5C when possible. A U-shaped number 10 is provided which includes a pair of legs $L_1$ and $L_2$. The legs $L_1$ and $L_2$ includes distributed inductance and as best shown in FIG. 5B comprise rectangular shaped strips of metal having a rectangular cross section. The legs $L_1$ and $L_2$ are connected at one end by a portion 12 of the U-shaped member 10. The material of the U-shaped structure should comprise one having a characteristic to provide a sufficient distributed inductance at the operating frequencies of the tuning circuit as well as having sufficient resiliency to act as a cantilever type of spring. For example, spring steel could be used. Alternately, a hinged type of structure could be used in place of the U-shaped member.

The U-shaped member 10 is held in a cantilever fashion by a mounting member 14, which comprises an insulating material. The portion 12 of the member 10 extends through the back portion of the support member 14 so that electrical conections may be made thereto at the junction B. The member 14 is secured to a base member 16 which comprises an electrically conductive material, by for example bolts, rivets or other fastening devices.

Secured at the free ends of the legs $L_1$ and $L_2$ are a pair of capacitor plates 18 and 20, respectively. The capacitor plates 18 and 20 correspond respectively to the ungrounded sides of the capacitors $C_1$ and $C_2$ as shown in FIG. 1. To complete the physical structure of the capacitors $C_1$ and $C_2$, a common capacitor plate 22 is secured to the base member 16 directly below the plates 18 and 20 spaced a distance away therefrom so that capacitive values for the capacitor $C_1$ and $C_2$ are developed thereacross. By changing the distance between the plates 18–20 and 22 the value of capacitance developed thereacross may be varied.

In order to vary the distance between the plates 18–20 and 22 a cam 24 is provided which is rotatable by shaft 26. A cam follower 28 is disposed over the top of each of the legs $L_1$ and $L_2$ adjacent the cam 24. The cam follower 28 should comprise an insulating material to isolate electrically the cam 24 from the electrical circuitry. The cam 24 is eccentrically mounted on a shaft 26 so that upon the rotation of the shaft 26, the cam 24 will engage the cam follower 28 which will force downwardly the capacitor plates 18 and 20. As mentioned above, the legs $L_1$ and $L_2$ are supported in a cantilever fashion and are fabricated of a material having some resilience. The legs $L_1$ and $L_2$ will, therefore, act as a spring against the force the cam 24. In a position shown, the capacitor plates 18–20 and 22 are at their farthest separated position and thus will have minimum capacitance at this position. By rotating the cam 24, the distance between the plates will be decreased with the capacitance increasing as the separating distance is decreased. With both plates 18 and 20 moving together as a unit, their capacitance with respect to the plate 22 will remain substantially constant being so ganged.

Accordingly it can be seen that a variable tuned circuit for tuning to frequencies within the UHF band of frequency is provided with the ganged variable capacitors, including the plates 18–20 and 22, operating in conjunction with the legs $L_1$ and $L_2$ to permit such tuning.

For tuning in the VHF band, the coil $L_3$ is connected between the point B, on the portion 12 of the U-shaped member 10, and the base member 16. Thus, signals coupled into the coil $L_3$ within the VHF frequency range may be tuned in response to the tuned circuit including the coil $L_3$ and the variable capacitors formed by the plates 18, 20 and 22.

To prevent excessive losses which may be due to radiations in the very high frequency band, a shield member, shown schematically by a dotted box 30 in FIG. 5A, is used to shield the relatively large loop created by the ganged capacitors and the legs $L_1$ and $L_2$. An additional advantage of the shielding 30 is that it will also improve the Q of the UHF tuned circuit.

It should also be noted that the cam 24 could be shaped to provide necessary changes in capacitance in a linear or a non-linear fashion which would be advantageously provided for accurate tuning in both the UHF and the VHF frequency bands.

It should be understood that the tuning circuits described herein have been done so in reference to a television tuner operative in either the VHF or UHF frequency bands. It should be observed, however, that the circuitry may be used with equal advantage in other types of electronic equipment such as FM receivers or other electronic equipment wherein it is desired to receive and tune to signals within two separate frequency bands.

Although the present invention has been described with a certain degree of particularity it should be understood that the present disclosure has been made only by way of example and that numerous changes in the details of construction and the combination and arrangement of parts, elements and components may be resorted to without departing from the spirit and scope of the present invention.

I claim as my invention:

1. A dual mode tuning circuit comprising a tuning member including leg portions including inductance therein, said leg portions being commonly connected at one end thereof, a capacitor plate electrically connected to each of said legs, a common capacitor plate disposed a distance away from said capacitor plates connected to said leg portions in such relationship to provide capacitance therebetween, a tuning inductor operatively connected between the commonly connected end of said leg portions and said common capacitor plate, and means for varying the capacitance developed between said capacitor plates to tune said circuit to a first band of frequencies by utilizing inductance of said leg portions as the inductive elements of the tuning circuit, and to a second band of frequencies by utilizing said tuning inductor as the inductive element of the tuning circuit.

2. A dual mode tuning circuit comprising: a tuning member including two legs including inductance therein, said legs being commonly connected at one end thereof, a capacitor plate disposed at the other end of each of said legs, a common capacitor plate disposed a distance away from said capacitive plates disposed on said legs in such relationship to provide capacitance therebetween, a tuning inductor operatively connected between the commonly connected end of said legs and said common capacitor plates, and means for changing the distance between said capacitor plate so that the capacitance therebetween may be varied to tune said circuit to a first band of frequencies by utilizing inductance of said two legs as the inductive elements of the tuning circuit and to a second band of frequencies by utilizing said tuning inductor as the inductive element of the tuning circuit.

3. A dual mode tuning circuit comprising: a tuning member including two substantially symmetrical legs including inductance therein, said legs being commonly connected at one end thereof and supported in a cantilever spring fashion, a capacitor plate disposed a distance away from said capacitive plates disposed on said legs in such a relationship to provide capacitance therebetween, a tuning inductor operatively connected between the common end of said legs and said common capacitor plate, cam means for operatively engaging said legs to change selectively the distance between said capacitor plates so that the capacitance therebetween may be varied to tune said circuit to a first band of frequencies by utilizing inductance of said two legs as the inductive elements of the tuning circuit and to a second band of frequencies by utilizing said tuning inductor as the inductive element of the tuning circuit, and means for shielding said tuning circuit from excessive losses.

4. A dual mode tuning element tunable to signals having frequencies within at least two frequency bands, said tuning element comprising: a bridge circuit including a pair of inductors having one end commonly connected and a pair of ganged variable capacitors having one end commonly connected and the other end connected to the other end of said pair of inductors, said bridge circuit being balanced at frequencies within a first of said bands so that said commonly connected ends of said inductors and capacitors are at a common potential; a second band tuning inductor operatively connected to one of said points of common potential so that it will not affect the tuning of said tuning element within said first band; first input means inductively coupled to said bridge circuit to apply input signals thereto having frequencies within said first band; first output means inductively coupled to said bridge circuit to provide output signals in response to the input signals applied to said first input means at the frequency to which said tuning element is tuned by said pair of capacitors and said pair of inductors of said bridge circuit within said first frequency band; second input means inductively coupled to said second band tuning inductor to apply input signals having frequencies within said second frequency band to said tuning element; and second output means inductively coupled to said tuning inductor to provide output signals in response to the input signals applied to said second input means at the frequency to which said tuning element is tuned by said pair of capacitors and said tuning inductor within said second band of frequencies.

5. A dual mode tuning circuit tunable to signals having frequencies within at least two frequency bands, said tuning element comprising: a bridge circuit including a pair of substantially symmetrical line members providing tuning inductances at frequencies within a first of said frequency bands and having one end commonly connected and a pair of ganged variable capacitors having one end commonly connected and the other end connected to the other end of said pair of lines, said bridge circuit being balanced at frequencies within a first of said bands so that said commonly connected ends of said inductors and capacitors are at a common potential, said line members providing negligible inductive reactance at frequencies within a second of said frequency bands; a second band tuning inductor to provide tuning inductances at the second of said band of frequencies operatively connected to one of said points of common potential so that it will not affect the tuning of said tuning element within said first band; first input means inductively coupled to said bridge circuit to apply input signals thereto having frequencies within said first band; first output means inductively coupled to said bridge circuit to provide output signals in response to the input signals applied to said first input means at the frequency to which said tuning element is tuned by said pair of capacitors and said pair of lines of said bridge circuit within said first frequency band; second input means inductively coupled to said second band tuning inductor to apply input signals having frequencies within said second frequency band to said tuning element; in second output means inductively coupled to said tuning inductor to provide output signals in response to the input signals applied to said second input means at the frequency to which said tuning element is tuned by said pair of capacitors and said tuning inductor within said second band of frequencies; and trimmer capacitor means for adjusting the tuned frequency at the upper end of each of said first and second frequency bands.

References Cited

UNITED STATES PATENTS

| | | | |
|---|---|---|---|
| 2,855,508 | 10/1957 | Barlow et al. | 333—76 X |
| 3,275,958 | 9/1966 | Rehm et al. | 334—3 |
| 2,384,504 | 9/1945 | Thias | 334—45 |
| 2,898,590 | 8/1959 | Pichitino | 333—76 XR |

OTHER REFERENCES

"The A.R.R.L. Antenna Book," The American Radio Relay League, Inc., West Hartford, Conn., 1956 (eighth edition), pp. 95–96.

"The Radio Amateur's Handbook," The American Radio Relay League, Inc., West Hartford, Conn., 1960 (37th edition), pp. 441–442.

"The Radio Amateur's Handbook," American Radio Relay League, West Hartford, Conn., 1963, title page and pages 55–56, 151, 449–452 relied upon.

ELI LIEBERMAN, *Primary Examiner.*

MARVIN NUSSBAUM, *Assistant Examiner.*

U.S. Cl. X.R.

334—80, 83